United States Patent [19]
Kaneshiro et al.

[11] Patent Number: 5,427,964
[45] Date of Patent: Jun. 27, 1995

[54] INSULATED GATE FIELD EFFECT TRANSISTOR AND METHOD FOR FABRICATING

[75] Inventors: Michael H. Kaneshiro, Phoenix; Diann Dow, Chandler, both of Ariz.

[73] Assignee: Motorola, Inc., Schaumburg, Ill.

[21] Appl. No.: 223,394

[22] Filed: Apr. 4, 1994

[51] Int. Cl.⁶ .......................................... H01L 21/265
[52] U.S. Cl. ..................... 437/41; 437/44; 437/45; 437/57
[58] Field of Search .................... 437/44, 45, 57, 41

[56] References Cited

U.S. PATENT DOCUMENTS

| | | | |
|---|---|---|---|
| 4,062,699 | 12/1977 | Armstrong | 437/44 |
| 4,898,835 | 2/1990 | Cawlfield . | |
| 4,949,136 | 8/1990 | Jian | 357/23.3 |
| 4,968,639 | 11/1990 | Bergonzoni | 437/44 |
| 5,147,811 | 9/1992 | Sakagami . | |
| 5,162,884 | 11/1992 | Liou et al. . | |
| 5,166,087 | 11/1992 | Kakimoto et al. . | |
| 5,171,700 | 12/1992 | Zamanian . | |
| 5,182,619 | 1/1993 | Pfiester . | |
| 5,202,276 | 4/1993 | Malhi . | |
| 5,248,627 | 9/1993 | Williams . | |
| 5,258,635 | 11/1993 | Nitayama et al. . | |
| 5,270,235 | 12/1993 | Ito . | |

OTHER PUBLICATIONS

C. F. Codella et al., "Submicron IGFET Device with Double Implanted Lightly Doped Drain/Source Structure", IBM Technical Disclosure Bulletin, vol. 26, No. 12, May 1984, pp. 6584-6586.

H. Yoshimura et al., "New CMOS Shallow Junction Well FET Structure (CMOS-SJET) for Low Power-Supply Voltage", IEEE, pp. 909-912 (Apr., 1992).

*Primary Examiner*—Brian E. Hearn
*Assistant Examiner*—Trung Dang
*Attorney, Agent, or Firm*—Rennie William Dover

[57] ABSTRACT

Insulated gate field effect transistors (10, 70) having independent process steps for setting lateral and vertical dopant profiles for source and drain regions. In a unilateral transistor (10), portions (48, 50, 51, 55) of the source region are contained within a halo region (34, 41) whereas portions (49, 47, 52, 64) of the drain region are non contained within a halo region. The source region (60, 65) has a first portion (48, 51) for setting a channel length and a second portion (50, 55) for setting a breakdown voltage and a source/drain capacitance. The second portion (50, 55) extends further into the halo region than the first portion (48, 51). In a bilateral transistor (70), portions (84, 89, 90, 91) of the drain region (72, 87) are contained within halo region (75, 79).

19 Claims, 7 Drawing Sheets

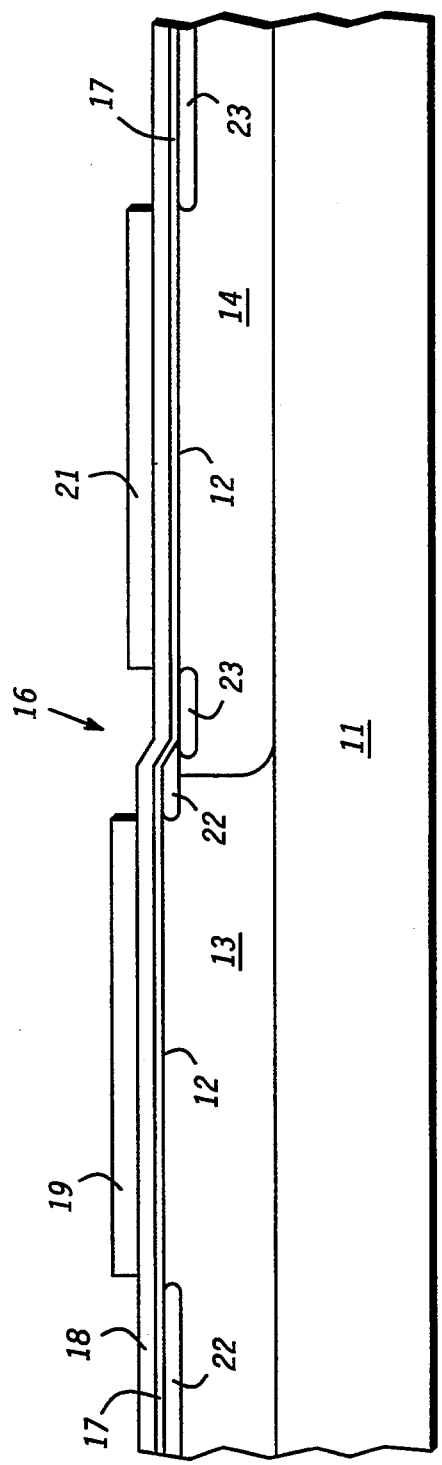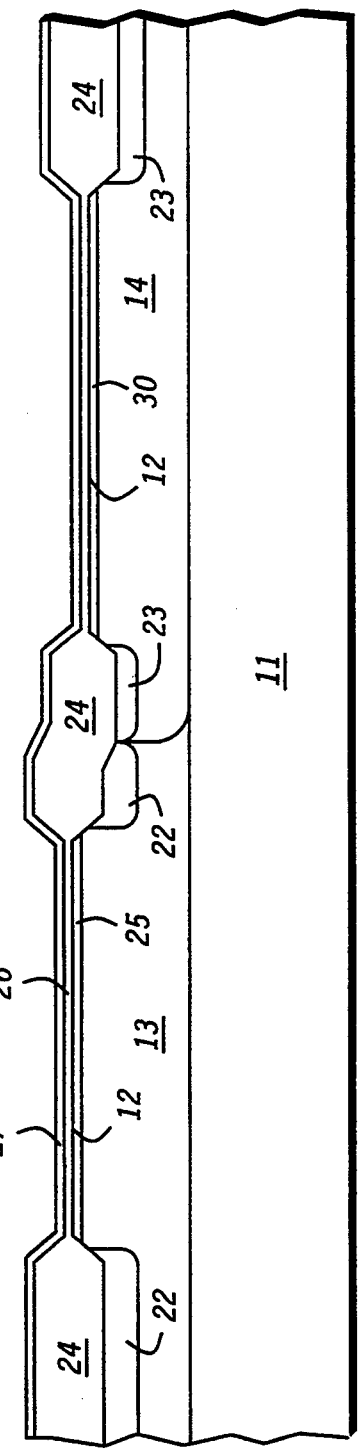
FIG. 1
FIG. 2

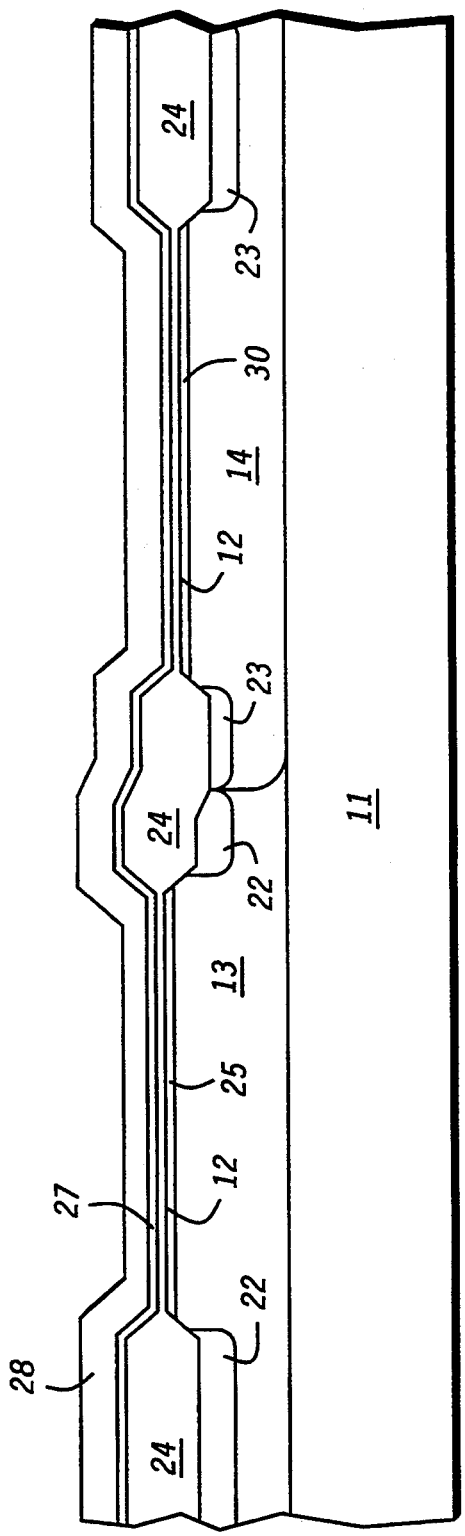
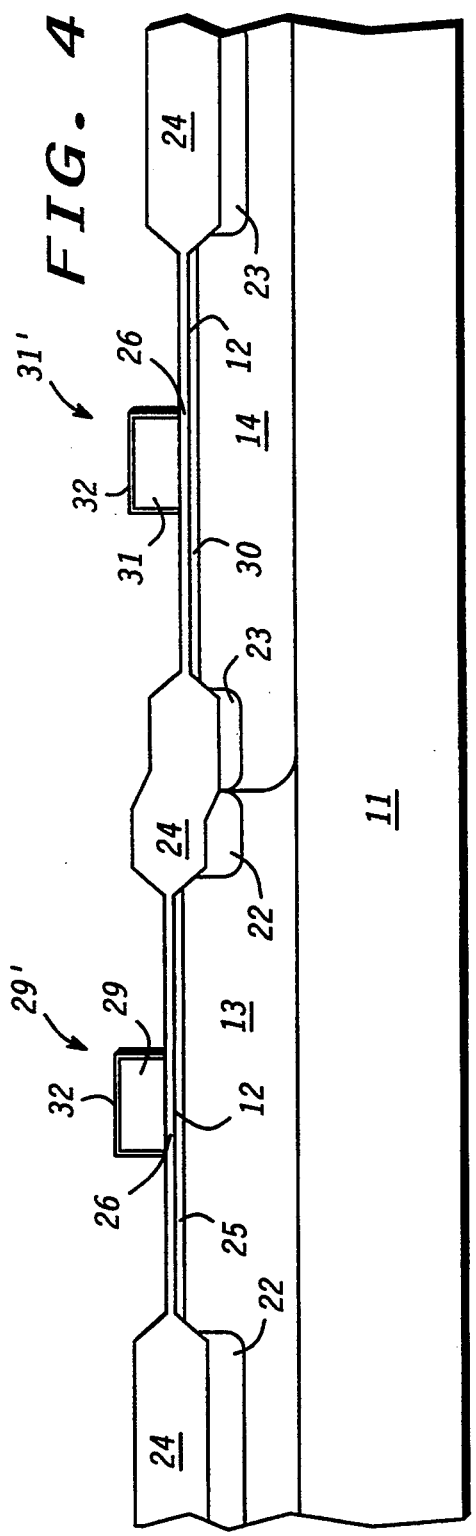

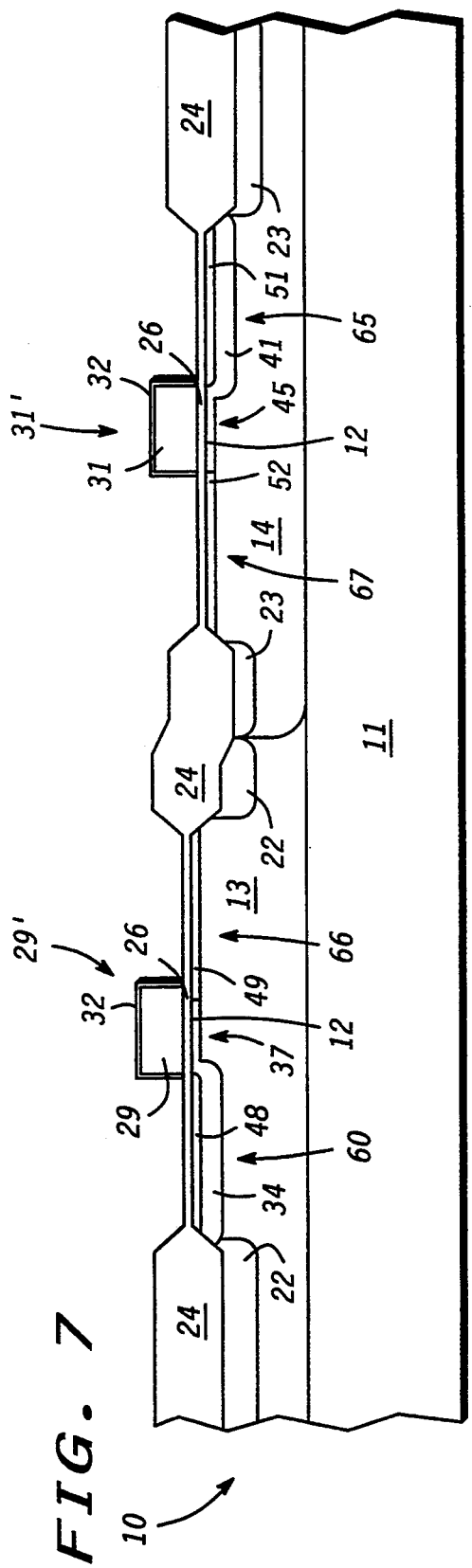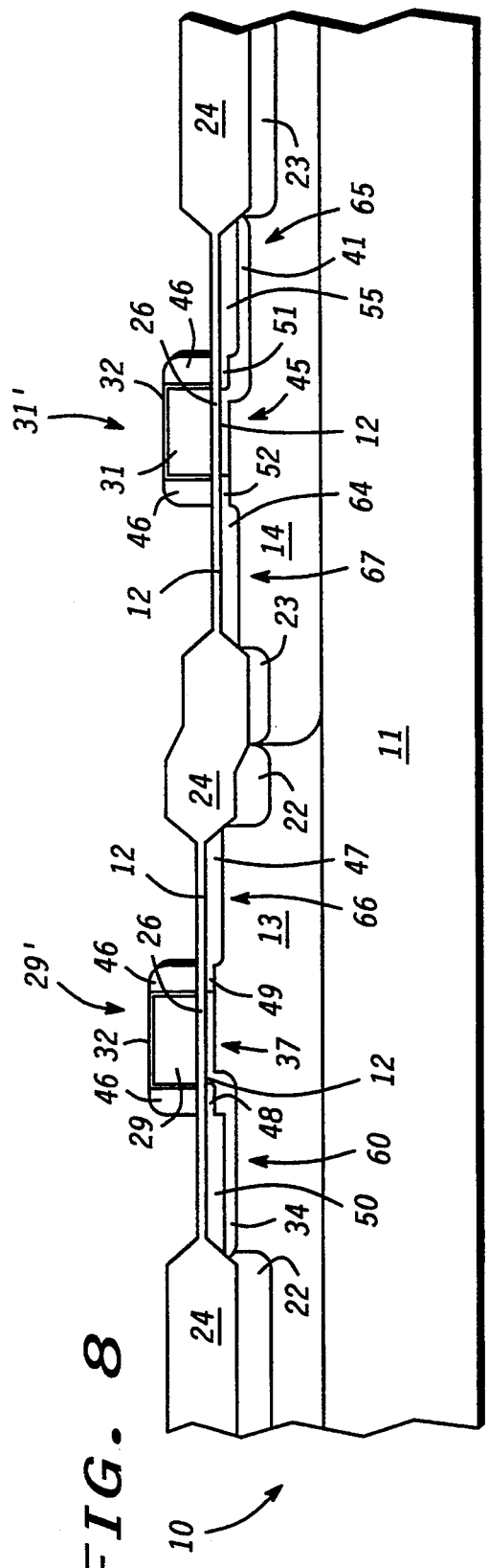

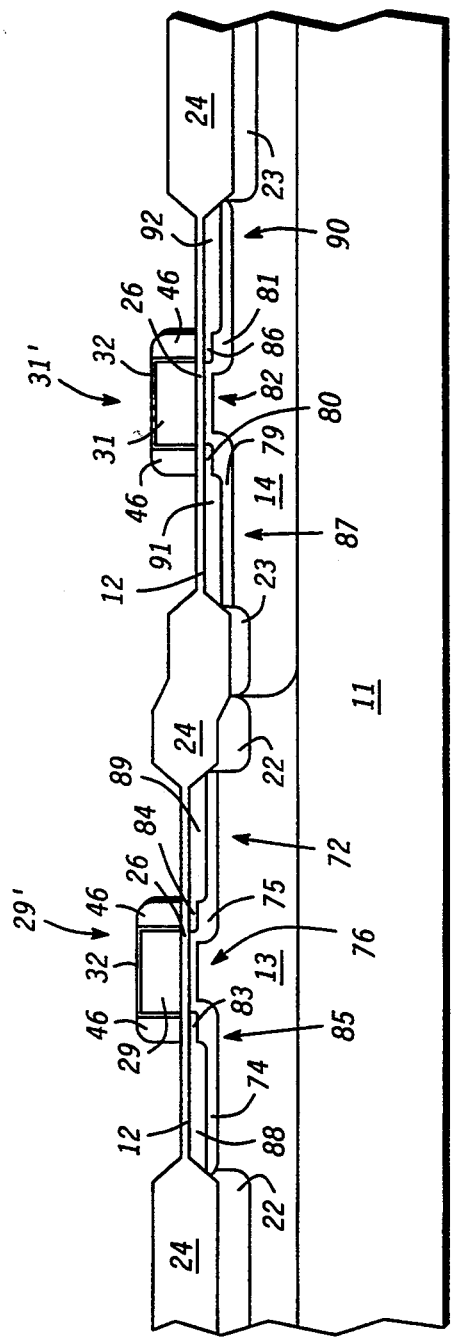
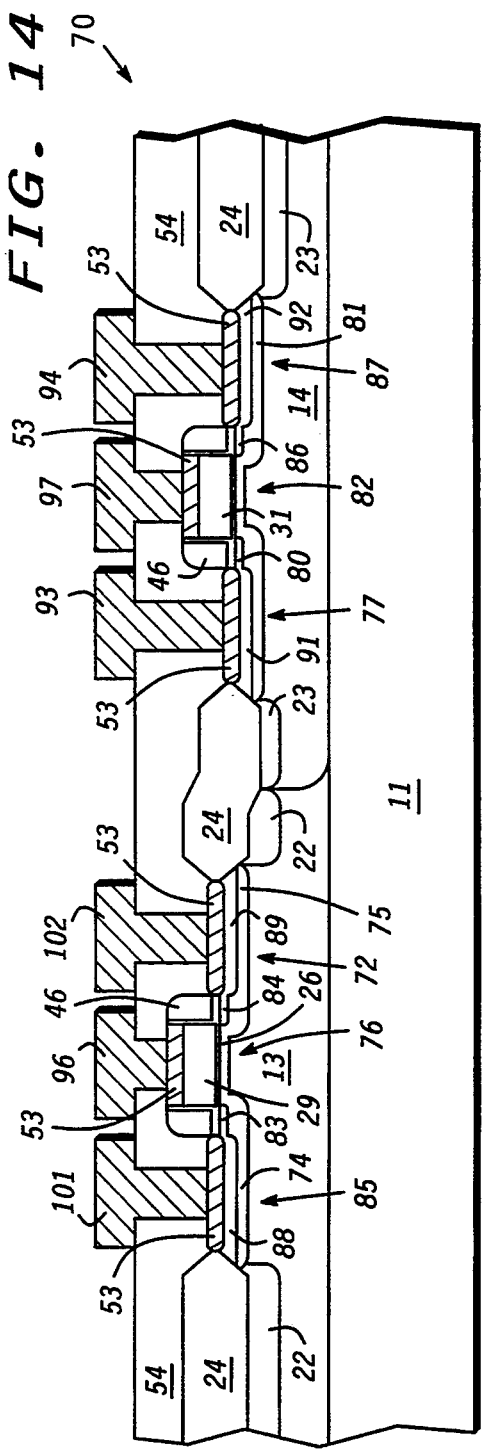

INSULATED GATE FIELD EFFECT TRANSISTOR AND METHOD FOR FABRICATING

CROSS-REFERENCE TO RELATED APPLICATIONS

The present application is related to U.S. patent application Ser. No. 08/223,393, Attorney's Docket No. SC08727P, entitled "INSULATED GATE FIELD EFFECT TRANSISTOR HAVING A SUBTHRESHOLD SWING AND METHOD FOR FABRICATING," filed on Apr. 4, 1994, by Vida Ilderem Burger et al. and assigned to the same assignee, Motorola, Inc.

The present application is further related to U.S. patent application Ser. No. 08/223,398, Attorney's Docket No. SC08872P, entitled "INSULATED GATE FIELD EFFECT TRANSISTOR HAVING A PARTIAL CHANNEL AND METHOD FOR FABRICATING", filed Apr. 4, 1994, by Vida Ilderem Burger and assigned to the same assignee, Motorola, Inc.

FIELD OF THE INVENTION

The present invention relates, in general, to integrated semiconductor devices, and more particularly, to the source and drain regions of insulated gate field effect transistors.

BACKGROUND OF THE INVENTION

An increasingly important use for insulated gate field effect transistors is in low voltage and low power applications such as portable communications and portable computers, i.e., pagers, cellular phones, digital logic, memories, etc. Since low power consumption is a primary goal in these applications, these types of transistors are typically designed to operate at supply voltages of less than 3.5 volts. However, semiconductor device parameters such as threshold voltage control, body effect, subthreshold leakage currents, parasitic source/drain capacitances, source/drain to substrate breakdown voltages, and source to drain punchthrough voltages typically limit the performance of low power semiconductor devices. More particularly, the higher dopant concentration required for punchthrough protection and threshold voltage control adversely affects the body effect, parasitic source/drain capacitances, and source to drain breakdown voltages.

One technique for providing punchthrough protection and threshold voltage control includes tailoring the dopant concentration profiles of the source and drain regions such that a lateral component of the dopant concentration profiles has a sufficient dopant concentration to prevent punchthrough and control the threshold voltage. However, this technique limits the depth of the vertical component of the dopant concentration profile. A consequence of shallow vertical concentration profiles is that the source and drain regions may be consumed during silicide formation, thereby destroying these regions.

Accordingly, it would be advantageous to have a method for fabricating insulated gate field effect transistors that reduces parasitic components such as source/drain capacitances and increases source/drain to substrate breakdown voltages. In addition, the method should independently optimize a lateral source/drain to channel dopant profile and a vertical source/drain to body dopant profile. It would be of further advantage for the method to improve control of the threshold voltage by allowing shallow dopant profiles and yet prevent junction shorts during contact formation. Further, the method should be easily integrated into insulated gate field effect transistor process flows.

BRIEF DESCRIPTION OF THE DRAWINGS

FIGS. 1-4 illustrate enlarged cross-sectional views of a portion of an insulated gate field effect transistor during beginning stages of fabrication in accordance with first and second embodiments of the present invention;

FIGS. 5-9 illustrate enlarged cross-sectional views of an insulated gate field effect transistor during fabrication in accordance with the first embodiment of the present invention; and FIGS. 10-14 illustrate enlarged cross-sectional views of an insulated gate field effect transistor during fabrication in accordance with the second embodiment of the present invention.

DETAILED DESCRIPTION OF THE DRAWINGS

Figure 5:
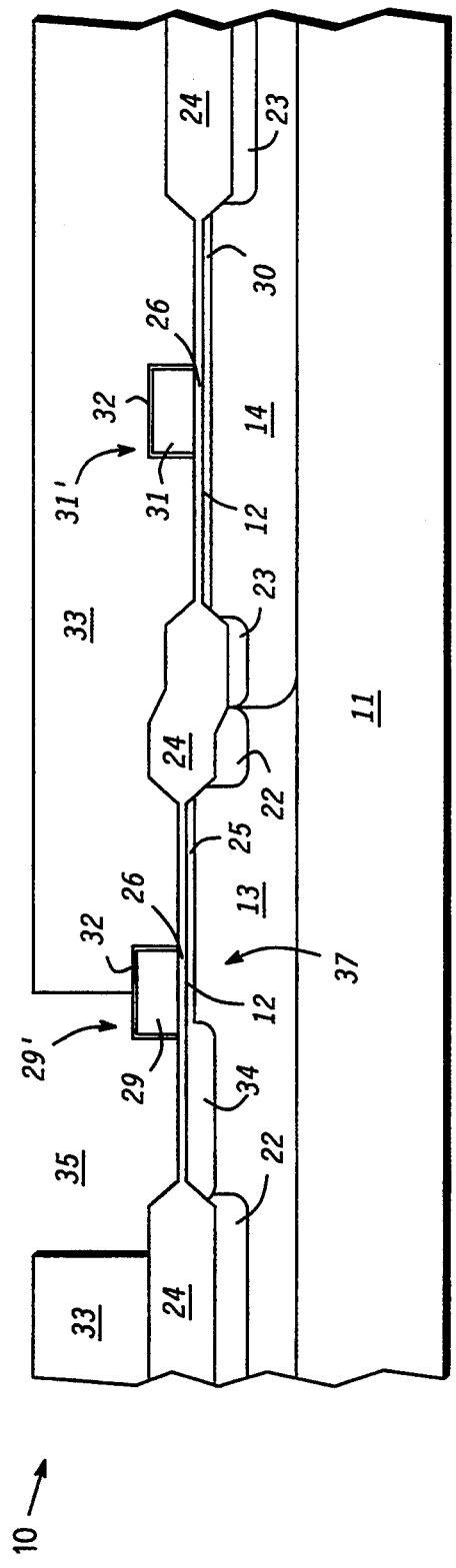

Generally, the present invention provides an integrated semiconductor device such as an insulated gate field effect transistor and a method of fabricating or forming the transistor. More particularly, the method allows fabrication of insulated gate field effect transistors having two source doping steps and two drain doping steps. Insulated gate field effect transistors manufactured using the method of the present invention have lower parasitic or junction capacitances and higher source/drain to substrate breakdown voltages than semiconductor devices manufactured using conventional processing techniques. Moreover, the method of the present invention allows decoupling of the process steps that set the lateral dopant profiles of the source/drain to channel regions from the process steps that set the vertical dopant profiles of the source/drain to channel regions. For optimum performance, the vertical integrated dopant profile extending from the source edge into the body should be similar to the lateral integrated dopant profile. The resulting active source will be shallow while the extrinsic source is deep enough to integrate other process modules.

Insulated gate semiconductor devices fabricated in accordance with the present invention may be fabricated as asymmetrical devices (unilateral embodiment) or as symmetrical devices (bilateral embodiment). In the unilateral embodiment, a halo region surrounds either the source region or the drain region of the insulated gate semiconductor device, whereas in the bilateral embodiment, halo regions surround both the source and drain regions of the insulated gate semiconductor device. In addition, both the unilateral and bilateral embodiments may include a dopant layer, wherein a portion of the dopant layer couples the source region to the drain region and extends a depth (d) into a semiconductor substrate from a major surface. Depth (d) is set by the relationship:

$$d < 2 \times \lambda_d \times \ln \sqrt{N_s/n_i}$$

where $\lambda_d = (\epsilon_s \times \epsilon_o \times k \times T/(q^2 \times N_s))^{\frac{1}{2}}$ and is referred to as a Debye length;

$n_i$ is the intrinsic carrier concentration;

$\epsilon_s$ is the silicon permittivity;

$\epsilon_o$ is the permittivity of free space ($8.86 \times 10^{-14}$ farad/cm);

k is Boltzmann's constant;

q is the electronic charge; and $N_s$ is the surface concentration of impurity atoms.

The Debye length is well known to those skilled in the art.

FIG. 1 illustrates an enlarged cross-sectional view of a portion of a partially completed low power insulated gate semiconductor device during processing in accordance with the unilateral embodiment of the present invention. What is shown in FIG. 1 is a semiconductor substrate 11 of P-conductivity type having a major surface 12. An impurity well 13 of P−-conductivity type, commonly referred to as a P-well, extends into semiconductor substrate 11 from a first portion of major surface 12 and an impurity well 14 of N−-conductivity type extends into substrate 11 from a second portion of major surface 12. P-well 13 laterally abuts N-well 14. Further, a step 16 or bird's beak is formed after the formation of N-well 14 and before the formation of P-well 13. Methods of forming wells 13 and 14 are commonly referred to as twin well processes and typically result in the formation of bird's beaks 16. Twin well processes and bird's beak formation are well known to those skilled in the art. By way of example, substrate 11 has a resistivity ranging between approximately 6 ohm-centimeter ($\Omega$-cm) and approximately 8 $\Omega$-cm, and wells 13 and 14 have a surface concentration on the order of $1 \times 10^{16}$ atoms per cubic centimeter (atoms/cm$^3$).

Using techniques well known to those skilled in the art, a layer of oxide 17 is formed on major surface 12, a layer of polysilicon 18 is formed on oxide layer 17, and a layer of nitride (not shown) is formed on layer of polysilicon 18. The layer of nitride is patterned to form islands over active areas or regions in which transistors are to be fabricated. Although the layer of nitride is not shown, a first portion 19 of the nitride layer serves as one island and a second portion 21 serves as another island. Additionally, layer of oxide 17, layer of polysilicon 18, and the layer of nitride form implant block masks over portions of wells 13 and 14. More particularly, first portion 19 serves as an implant block mask over a portion of P-well 13 and second portion 21 serves as an implant block mask over a portion of N-well 14. An additional implant block mask (not shown) of, for example, photoresist is formed over N-well 14. An impurity material of P conductivity type is implanted into portions of P-well 13 not protected by the implant block mask to form dopant regions 22. The additional implant block mask is removed and another implant block mask (not shown) of, for example, photoresist is formed over P-well 13 and dopant regions 22. An impurity material of N conductivity type is implanted into portions of N-well 14 not protected by the additional implant block mask to form dopant regions 23. Dopant regions 22 and 23 prevent inversion under field oxide regions 24 (shown in FIG. 2) and provide isolation punchthrough protection.

FIG. 2 illustrates an enlarged cross-sectional view of the portion of the partially completed low power insulated gate field effect transistor of FIG. 1 further along in processing. It shall be understood that the same reference numerals are used in the figures to denote the same elements. It shall be further understood that the concentrations and thicknesses provided in the description of the present invention merely serve as exemplary values and are not limitations of the present invention. An anneal is performed that forms field oxide regions 24 and drives in the impurity material of dopant regions 22 and 23, thereby enlarging dopant regions 22 and 23. Methods of forming dopant regions 22 and 23 are well known to those skilled in the art.

Portions 19 and 21 of the nitride layer, polysilicon layer 18 and oxide layer 17 are removed using techniques well known to those skilled in the art. A layer of sacrificial oxide (not shown) is grown on major surface 12 and further increases the thickness of field oxide regions 24. By way of example, the sacrificial oxide layer has a thickness of approximately 400 angstroms. The sacrificial oxide layer serves to oxidize any silicon nit ride film formed during field oxidation (Kooi effect) around the active region edges.

The sacrificial oxide layer is removed and a layer of gate oxide 26 is formed on major surface 12 and in field oxide regions 24. A layer of polysilicon 27 is formed on gate oxide layer 26 and serves to protect gate oxide layer 26 from implant damage during subsequent processing steps. By way of example, gate oxide layer 26 has a thickness of approximately 105 angstroms and polysilicon layer 27 has a thickness of approximately 500 angstroms.

Optionally, dopant layers 25 and 30 are formed in wells 13 and 14, respectively. To form dopant layer 25, an implant block mask (not shown) such as, for example, photoresist is formed over N-well 14 and an impurity material of P conductivity type is implanted into P-well 13, thereby forming dopant layer 25. Preferably, dopant layer 25 is between two adjacent field oxide regions 24. Subsequently, the implant block mask over N-well 14 is removed and an implant block mask (not shown) such as, for example, photoresist is formed over P-well 13 and an impurity material of N conductivity type is implanted into N-well 14 to form a dopant layer 30. Preferably, dopant layer 30 is also between two adjacent field oxide regions 24.

The depth and dopant concentrations of layers 25 and 30 are selected to set the $V_T$ of the insulated gate field effect transistors. For example, a $V_T$ selected in the range of approximately 400 millivolts (mV) to approximately 600 mV may be achieved by forming layers 25 and 30 to have a surface concentration ranging between approximately $7 \times 10^{16}$ atoms/cm$^3$ and approximately $2 \times 10^{17}$ atoms/cm$^3$. A suitable set of implant conditions to obtain this surface concentration includes an implant dose ranging between approximately $1 \times 10^{12}$ atoms/cm$^2$ and approximately $3 \times 10^{12}$ atoms/cm$^2$, an implant energy for forming dopant layer 25 ranging between approximately 20 kilo-electron volts (KeV) and approximately 30 KeV, and the implant energy for forming dopant layer 30 ranging between approximately 70 KeV and approximately 90 KeV. As those skilled in the art will understand, a specific value for $V_T$ is a design choice and is obtained in accordance with dose and implant energies used in the formation of dopant layers 25 and 30. Preferably, dopant layers 25 and 30 extend from major surface 12 a distance less than the product of twice the Debye length and the natural logarithm of the square root of a ratio of a surface concentration to an intrinsic carrier concentration.

Now referring to FIG. 3, the implant block mask over P-well 13 is removed. A layer of polysilicon 28 is formed on polysilicon layer 27. By way of example, polysilicon layer 28 has a thickness of approximately 3,000 angstroms. Polysilicon layer 28 serves as a gate conductor layer. Methods for forming gate oxide layers such as gate oxide layer 26 and polysilicon layers such as polysilicon layer 28 are well known to those skilled in the art. In addition, the techniques used in preparation for the formation of gate oxide layer 26 and polysilicon layer 28, i.e., formation of a sacrificial oxide layer and polysilicon layer 27 are also known in the semiconductor processing art.

FIG. 4 illustrates an enlarged cross-sectional view of the portion of the partially completed low power insulated gate field effect transistor of FIG. 3 further along in processing. Layer of polysilicon 28 is patterned to form polysilicon gate electrodes 29 and 31 over P-well 13 and N-well 14, respectively. Gate electrodes 29 and 31 in conjunction with the portions of gate oxide layer 26 between major surface 12 and gate electrodes 29 and 31 form gate structures 29' and 31' respectively. An oxide layer 32 is formed on polysilicon gate electrodes 29 and 31. As those skilled in the art are aware, oxide layer 32 serves to re-grow the portions of gate oxide layer 26 that have been undercut. It should be understood that oxide layer 32 is thinner than gate oxide layer 26. Thus, to simplify the figures and the description, gate oxide layer 26 refers to the portions of gate oxide layer 26 covered by oxide layer 32 as well as the portion of gate oxide layer 26 covered by gate electrodes 29 and 31.

FIG. 5 illustrates an enlarged cross-sectional view of the portion of the partially completed complementary low power insulated gate field effect transistor 10. It shall be understood that the processing steps described in FIGS. 1-4 are common to both the unilateral insulated gate semiconductor device and the bilateral insulated gate semiconductor device. FIGS. 5-9, on the other hand, describe a method of fabricating an insulated gate semiconductor device in accordance with the unilateral embodiment of the present invention. An implant block mask 33 of, for example, photoresist is formed on layer of oxide 32. Photoresist 33 is patterned to form a window 35 which exposes layer of oxide 32 over a portion of polysilicon gate electrode 29 and a portion of gate oxide layer 26 covering P-well 13. The exposed portion of gate oxide layer 26 covering P-well 13 is adjacent one side of polysilicon gate electrode 29.

An impurity material of P conductivity type such as, for example, boron is implanted into a portion of P well 13 using a zero degree implant to form a dopant region 34. Dopant region 34 is also referred to as a halo or pocket region and extends laterally under a portion of gate structure 29'. In other words, dopant region 34 extends laterally from the first side of gate structure 29' to a position below gate structure 29'. By way of example, dopant region 34 has a concentration ranging from approximately $1 \times 10^{17}$ atoms/cm$^3$ to approximately $5 \times 10^{18}$ atoms/cm$^3$ and vertically extends approximately 0.6 microns ($\mu$m) into dopant well 13 from major surface 12. It shall be understood that the implant energy is set so that the impurity material of P conductivity type does not penetrate gate electrode 29, and thus is not implanted into portion 37 of dopant layer 25. The concentration of the impurity material of P conductivity type of dopant region 34 is much greater than that of dopant layer 25, thus the portion of dopant layer 25 through which dopant region 34 extends becomes a part of dopant region 34.

Figure 6:
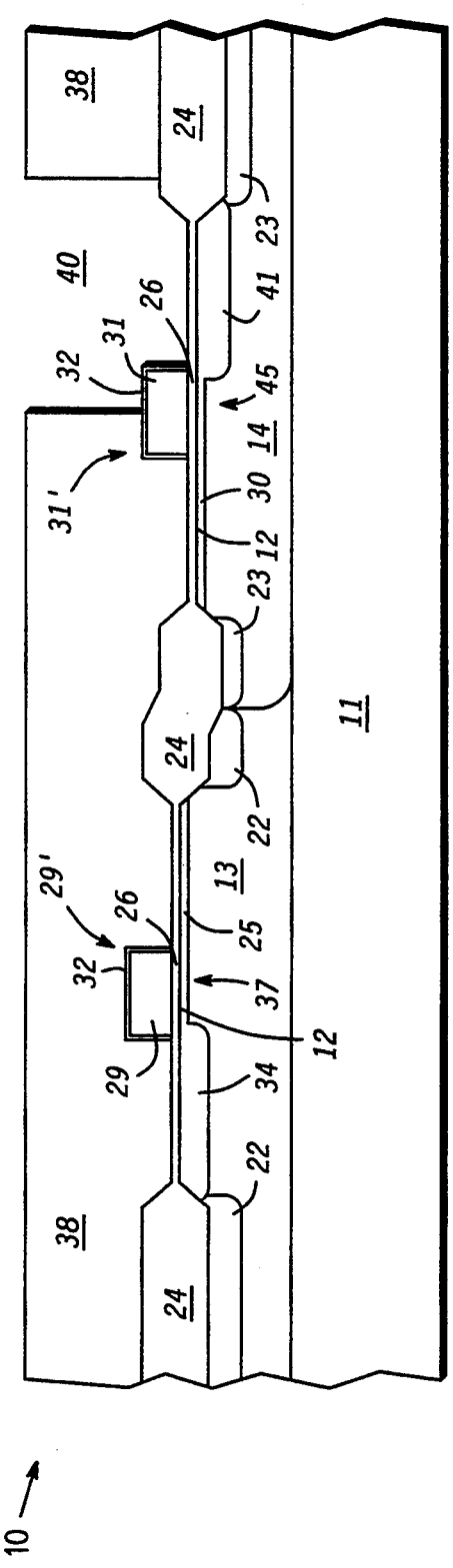

Referring now to FIG. 6, implant block mask 33 is removed and another implant block mask 38 of, for example, photoresist is formed on layer of oxide 32. Photoresist 38 is patterned to form a window 40 which exposes layer of oxide 32 over a portion of polysilicon gate electrode 31 and a portion of gate oxide layer 26 covering N-well 14. In addition, a portion of field oxide region 24 adjacent N-well 14 is also exposed. An impurity material of N conductivity type such as, for example, phosphorus is implanted into a portion of N-well 14 to form a dopant region 41. Dopant region 41 is also referred to as a halo or pocket region and extends laterally under a portion of gate structure 31'. By way of example, dopant region 41 has a concentration ranging from approximately $1 \times 10^{17}$ atoms/cm$^3$ to approximately $5 \times 10^{18}$ atoms/cm$^3$ and vertically extends approximately 0.6 $\mu$m into dopant well 14 from major surface 12. It should be understood that the implant energy is set so that the impurity material of N conductivity type does not penetrate gate structure 31', and thus is not implanted into portion 45 of dopant layer 30 covered by gate structure 31'. The concentration of the impurity material of N conductivity type of dopant region 41 is much greater than that of dopant layer 30, thus the portion of dopant layer 30 through which dopant region 41 extends becomes a part of dopant region 41. Implant block mask 38 is removed. Techniques for forming and removing implant block masks such as masks 33 and 38 are well known to those skilled in the art.

FIG. 7 illustrates an enlarged cross-sectional view of the portion of the complementary low power insulated gate field effect transistor 10 of FIG. 6 further along in processing. A portion 48 of a source region 60 and a portion 49 of a drain region 66 are formed in P-well 13 adjacent polysilicon gate structure 29'. To form dopant layers 48 and 49, an implant block mask (not shown) such as, for example, photoresist is formed over N-well 14 and an impurity material of N conductivity type is implanted into regions 60 and 66. More particularly, portion 48 is formed in a portion of P-well 13 aligned to a first side of gate structure 29' and portion 49 is formed in a portion of P-well 13 aligned to a second side of gate structure 29'. Portions 48 and 49 are of N conductivity type, are formed using, for example, arsenic, and extend laterally under portions of gate structure 29'. It should also be understood that portion 48 is contained within halo region 34 and that halo region 34 extends laterally further under gate structure 29' than portion 48. In other words, portion 48 is a dopant region that extends laterally from the first side of gate structure 29' to a position below gate structure 29'. Simultaneously with the formation of portions 48 and 49, polysilicon gate electrode 29 is doped to be of N conductivity type, e.g., doped with arsenic. It shall be understood that the implant energy is set so that the impurity material of N conductivity type does not penetrate gate electrode 29, and thus is not implanted into portion 37 of dopant layer 25.

Further, a portion 51 of a source region 65 and a portion 52 of a drain region 67 are formed in N-well 14 and are aligned to polysilicon gate structure 31'. To form dopant layers 51 and 52, an implant block mask (not shown) such as, for example, photoresist is formed over P-well 13 and an impurity material of P type conductivity is implanted into regions 65 and 67. More particularly, portion 51 is aligned to a first side of gate structure 31' and portion 52 is aligned to a second side of gate structure 31'. Portions 51 and 52 are of P conductivity type, are formed using, for example, boron, and extend laterally under portions of gate structure 31'.

It should be understood that halo region 41 extends further under gate structure 31' than portion 51. Simultaneously with the formation of portions 51 and 52, polysilicon gate electrode 31 is doped to be of P conductivity type, e.g., doped with the boron. The implant energy is set so that the impurity material of P conductivity type does not penetrate gate electrode 31, and thus is not implanted into portion 45 of dopant layer 30. By way of example, portions 48 and 51 and portions 49 and 52 extend vertically between approximately 0.2 μm and approximately 0.3 μm into their respective wells 13 and 14 from major surface 12. Preferably portions 48 and 51 are contained within halo regions 34 and 41, respectively.

Now referring to FIG. 8, an oxide layer (not shown) is formed on oxide layer 32. The oxide layer has a thickness on the order of 300 angstroms and may be formed by well known processes such as a tetraethylorthosilicate (TEOS) deposition process. Dielectric spacers 46 are formed along the portions of oxide layer 32 lining the sidewalls of polysilicon gate electrodes 29 and 31. By way of example, dielectric spacers 46 are nitride spacers.

A portion 50 of a source region 60 and a portion 47 of a drain region 66 are formed in P-well 13 adjacent to dielectric spacers 46. To form portions 50 and 47, an implant block mask (not shown) such as, for example, photoresist is formed over N-Well 14 and an impurity material of N type conductivity is implanted into regions 60 and 66. More particularly, portion 50 is formed in a portion of P-well 13 aligned to a first side of dielectric spacer 46 and portion 47 is formed in a portion of P-well 13 aligned to a second side of dielectric spacer 46. Portions 50 and 47 are of N conductivity type, are formed using, for example, arsenic, and extend laterally under dielectric spacer 46. It shall also be understood that portion 50 is contained within halo region 34. Thus, portions 50 and 47 are formed by doping sub-portions of P-well 13, wherein portions 50 and 47 extend vertically through portions 48 and 49, respectively. Simultaneously with the formation of portions 50 and 47, polysilicon gate electrode 29 is further doped with the impurity material of N conductivity type, e.g., doped with arsenic. It shall be understood that the implant energy is set so that the impurity material of N conductivity type does not penetrate gate electrode 29 or dielectric spacer 46, and thus is not implanted into portion 37 of dopant layer 25.

Further, a portion 55 of a source region 65 and a portion 64 of a drain region 67 are formed in N-well 14 and are aligned to dielectric spacer 46. To form portions layers 55 and 64, an implant block mask (not shown) such as, for example, photoresist is formed over P-Well 13 and an impurity material of P conductivity type is implanted into regions 65 and 67. More particularly, portion 55 is aligned to a first side of dielectric spacer 46 and portion 64 is aligned to a second side of dielectric spacer 46. Portions 55 and 64 are of P conductivity type, and are formed using, for example, boron, and extend laterally under portions of dielectric spacer 46. Thus, portions 55 and 64 are formed by doping sub-portions of N-well 14, wherein portions 55 and 64 extend vertically through portions 51 and 52, respectively. It should be understood that halo region 41 extends further under dielectric spacer 46 than portion 55. Simultaneously with the formation of portions 55 and 64, polysilicon gate electrode 31 is further doped with the impurity material of P conductivity type, e.g., doped with the boron. The implant energy is set so that the impurity material of P conductivity type does not penetrate gate electrode 31 or dielectric spacer 46, and thus is not implanted into portion 45 of dopant layer 30. By way of example, portions 50 and 55 and portions 47 and 64 extend vertically deeper than approximately 0.2 μm into their respective wells 13 and 14 from major surface 12. Preferably, portions 50 and 55 are contained within halo regions 34 and 41, respectively.

Dopant regions 50 and 55 are formed through portions 48 and 51, respectively, wherein dopant regions 50 and 55 extend into halo regions 34 and 41. Dopant region 50 does not extend beyond halo region 34, i.e., dopant region 50 is vertically bounded by halo region 34 and dopant region 55 does not extend beyond halo region 41, i.e., dopant region 55 is vertically bounded halo region 41. Dopant regions 50 and 55 serve as portions of source regions 60 and 65, respectively. In other words, portions 48 and 50 cooperate to form source region 60 and portions 51 and 55 cooperate to form a source region 65. Dopant regions 47 and 64 are formed through portions 49 and 52, respectively, wherein dopant regions 47 and 64 serve as portions of drain regions 66 and 67, respectively. In other words, portion 49 and portion 47 cooperate to form drain region 66 and portion 52 and portion 64 cooperate to form drain region 67. Methods for forming dielectric spacers and dopant regions are well known to those skilled in the art.

Portions 48 and 49 are shallower than portions 50 and 47. Likewise, portions 51 and 52 are shallower than portions 55 and 64, respectively. It shall be understood that dopant concentrations at the intersection of portion 48 and halo region 34 may be approximately the same as the dopant concentrations at the intersection of portion 50 and halo region 34. Likewise, dopant concentrations at the intersection of portion 51 and halo region 41 may be approximately the same as the dopant concentrations at the intersection of portion 55 and halo region 41. The advantages of separately setting the dopant concentrations at the intersection of portions 48 and 51 and their respective halo regions 34 and 41 are that the portions 48 and 51 of the source regions 60 and 65, respectively, can be optimized for $V_T$ control, whereas the halo regions 34 and 41 can be optimized for punchthrough protection and may lower the body effect. Further, portions 47 and 64 of the drain regions 66 and 67, respectively, can be optimized for junction capacitances and breakdown voltages while allowing for the integration of subsequent process modules.

Figure 9:
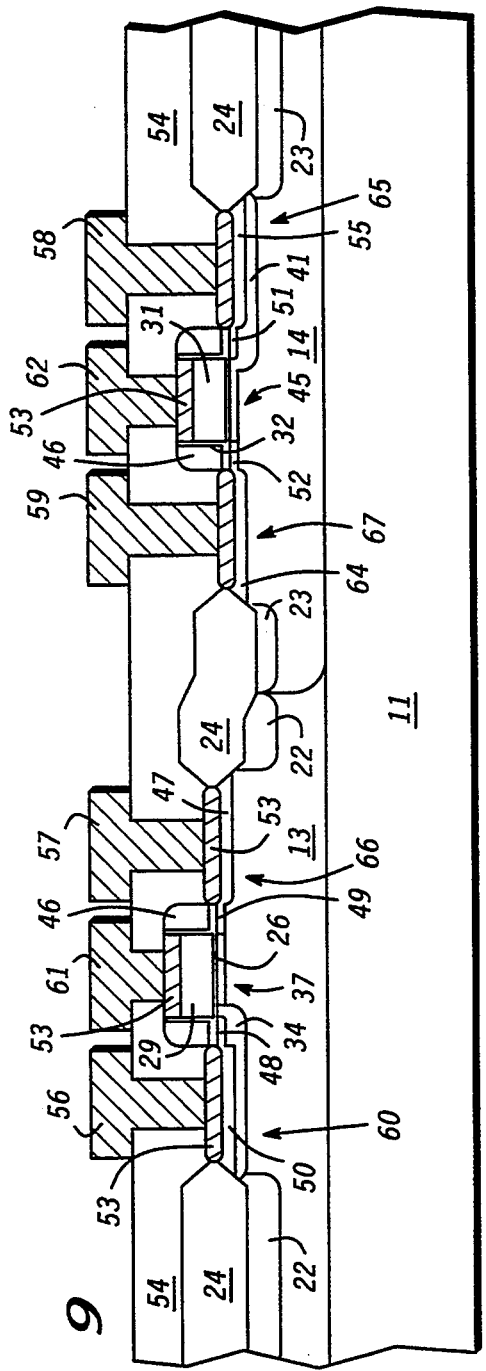

Now referring to FIG. 9 and using techniques well known to those skilled in the art, electrodes are formed which contact portion 50 of source region 60, portion 47 of drain region 66, portion 55 of source region 65, and portion 64 of drain region 67. For example, silicide 53 may be formed in source regions 60 and 65, drain regions 66 and 67 and in polysilicon gate electrodes 29 and 31. Nitride spacers 46 prevent source and drain regions 60 and 66, respectively, from being shorted with polysilicon gate electrode 29 and source and drain regions 65 and 67, respectively, from being shorted with polysilicon gate electrode 31 after silicidation. An insulating layer 54 is formed on device 10, i.e., on field oxide regions 24, source regions 60 and 65, drain regions 66 and 67, and polysilicon gate electrodes 29 and 31. A plurality of openings (not shown) are formed in insulating layer 54 to expose portions of silicide 53 in source regions 60 and 65, drain regions 66 and 67, and polysilicon gate electrodes 29 and 31. Source and drain electrodes 56 and 57, respectively, are formed to contact the silicide 53 in the respective source and drain regions 60 and 66, source and drain electrodes 58 and 59, respectively, are formed to contact the silicide 53 in the respective source and drain regions 65 and 67, and gate electrodes 61 and 62 are formed to contact the silicide on polysilicon gate electrodes 29 and 31, respectively. Methods of forming electrodes to silicided regions are well known to those skilled in the art.

Thus, the unilateral embodiment of the present invention comprises a method for fabricating complementary insulated gate semiconductor device 10 having source regions 60 and 65, drain regions 66 and 67, and gate electrodes 29 and 31. Although a complementary unilateral low power insulated gate semiconductor device 10 has been described, it shall be understood that individual unilateral N-channel and P-channel insulated gate semiconductor devices may also be fabricated in accordance with the present invention.

Figure 10:
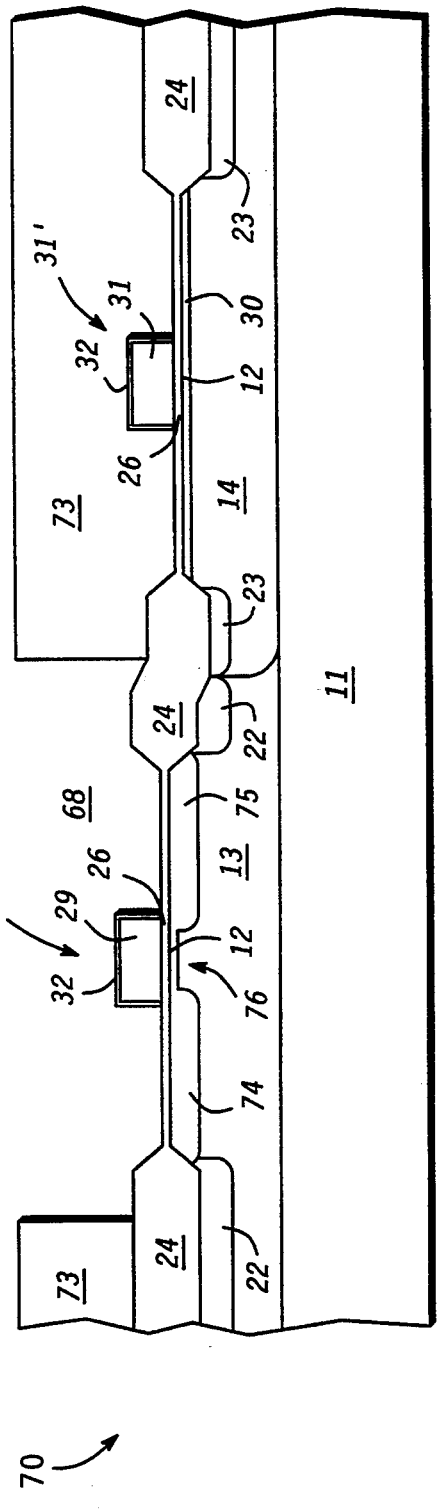

FIGS. 10-14 illustrate enlarged cross-sectional views of a portion of a complementary low power insulated gate field effect transistor 70 in accordance with a bilateral embodiment of the present invention during various stages of processing. More particularly, FIG. 10 illustrates an enlarged cross-sectional view of a portion of the partially completed complementary low power insulated gate field effect transistor 70 of FIG. 4 further along in processing. As discussed supra, FIGS. 1-4 are common to both the unilateral and bilateral embodiments of the present invention, thus the unilateral embodiment is illustrated in FIGS. 5-9 and the bilateral embodiment is illustrated in FIGS. 10-14. Still referring to FIG. 10, an implant block mask 73 of, for example, photoresist is formed on layer of oxide 32. Photoresist 73 is patterned to form a window 68 which exposes layer of oxide 32 over polysilicon gate electrode 29 and the portion of gate oxide layer 26 covering P-well 13. It should be understood that oxide layer 32 is thinner than gate oxide layer 26. Thus, to simplify the figures and the description, gate oxide layer 26 refers to the portions of gate oxide layer 26 covered by oxide layer 32 as well as the portion of gate oxide layer 26 covered by gate electrodes 29 and 31. In addition, a portion of field oxide region 24 adjacent P-well 13 is also exposed.

An impurity material of P conductivity type such as, for example, boron is implanted into a portion of P well 13 to form dopant regions 74 and 75. Dopant regions 74 and 75 are also referred to as halo or pocket regions. Dopant region 74 extends laterally from the first side of gate structure 29' to a position below gate structure 29' and dopant region 75 extends laterally from the second side of gate structure 29' to a position below gate structure 29'. By way of example, dopant regions 74 and 75 have a concentration ranging from approximately $1 \times 10^{17}$ atoms/cm$^3$ to approximately $5 \times 10^{18}$ atoms/cm$^3$, and extend vertically approximately 0.6 μm into dopant well 13 from major surface 12. It should be understood that the implant energy is set so that the impurity material of P conductivity type does not penetrate gate structure 29', and thus is not implanted into portion 76 of dopant layer 25 which is covered by gate electrode 29. The concentration of the impurity material of P conductivity type of dopant regions 74 and 75 is much greater than that of dopant layer 25, thus the portion of dopant layer 25 through which dopant regions 74 and 75 extend becomes a part of dopant regions 74 and 75.

Figure 11:
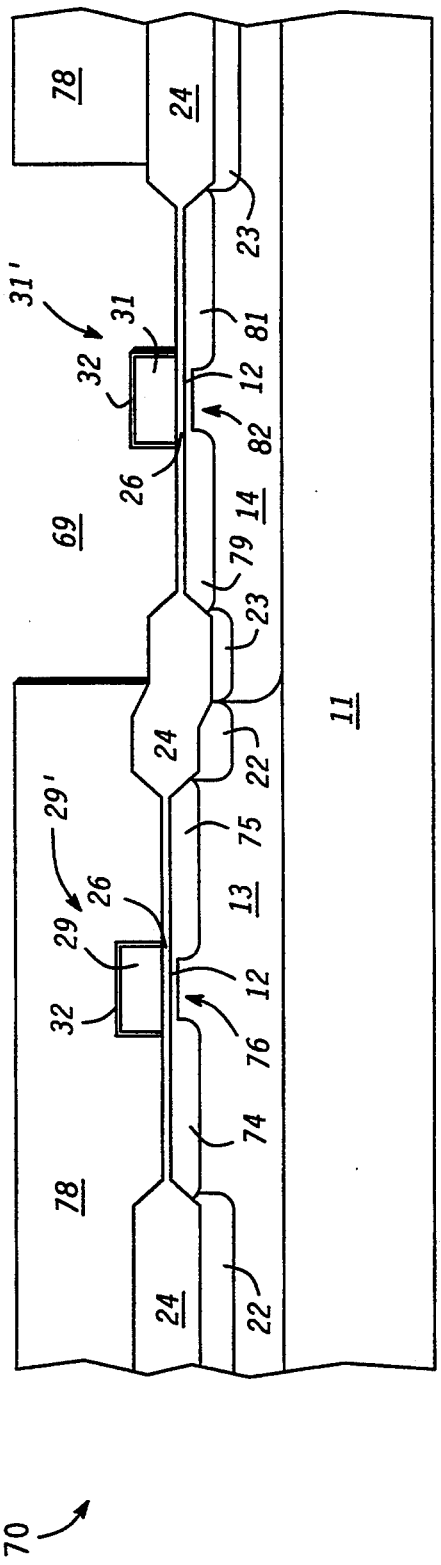

Referring now to FIG. 11, implant block mask 73 is removed and another implant block mask 78 of, for example, photoresist is formed on layer of oxide 32. Photoresist 78 is patterned to form a window 69 which exposes layer of oxide 32 over polysilicon gate electrode 31 and gate oxide layer 26 covering N-well 14. An impurity material of N conductivity type such as, for example, phosphorus is implanted into a portion of N-well 14 to form dopant regions 79 and 81. Dopant regions 79 and 81 are also referred to as halo or pocket regions and laterally extend under portions of gate structure 31'. Dopant region 81 extends laterally from the first side of gate structure 31' to a position below gate structure 31' and dopant region 79 extends laterally from the second side of gate structure 31' to a position below gate structure 31'.

By way of example, dopant regions 79 and 81 have a surface concentration ranging from approximately $1 \times 10^{17}$ atoms/cm$^3$ to approximately $5 \times 10^{18}$ atoms/cm$^3$, and vertically extend approximately 0.6 μm into dopant well 14 from major surface 12. It shall be understood that the implant energy is set so that the impurity material of N conductivity type does not penetrate gate structure 31', and thus is not implanted into portion 82 of dopant layer 30 which is covered by gate electrode 31. The concentration of the impurity material of N conductivity type of dopant regions 79 and 81 is much greater than that of dopant layer 30, thus the portions of dopant layer 30 through which dopant regions 79 and 81 extend become a part of dopant regions 79 and 81. Implant block mask 78 is removed. Techniques for forming and removing implant block masks such as masks 73 and 78 are well known to those skilled in the art.

Figure 12:
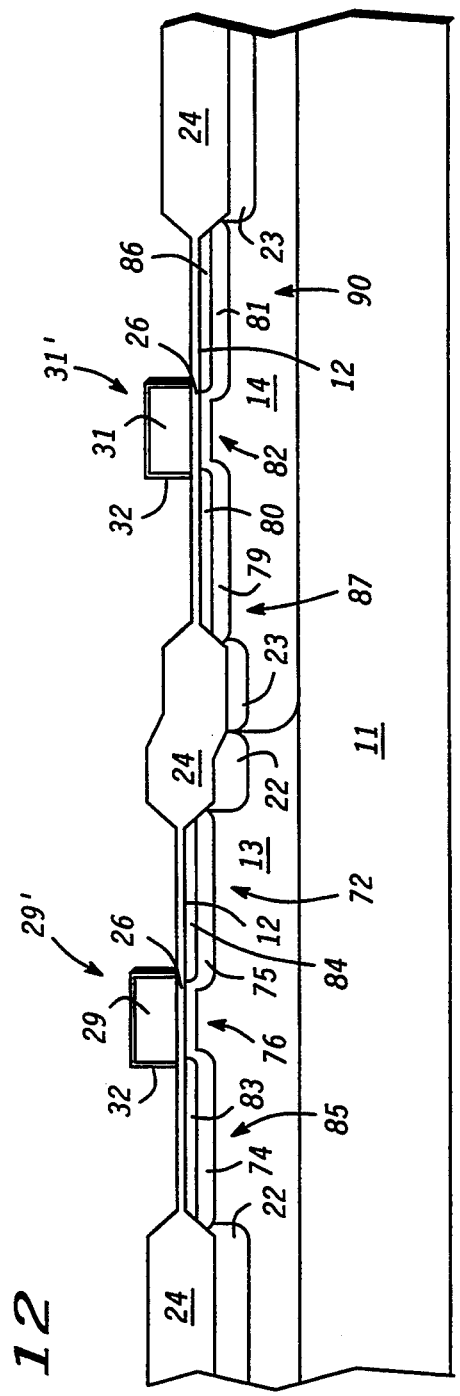

FIG. 12 illustrates an enlarged cross-sectional view of the portion of the complementary low power insulated gate field effect transistor 70 of FIG. 11 further along in processing. A portion 83 of a source region 85 and a portion 84 of a drain region 72 are formed in P-well 13 adjacent polysilicon gate electrode 29. To form dopant layers 83 and 84, an implant block mask (not shown) such as, for example, photoresist is formed over N-Well 14 and an impurity material of N conductivity type is implanted into regions 85 and 72. More particularly, portion 83 is formed in a portion of P-well 13 aligned to a first side of gate structure 29' and portion 84 is formed in a portion of P-well 13 aligned to a second side of gate structure 29'. Portions 83 and 84 are of N conductivity type, and are formed using, for example, arsenic, and extend laterally under portions of gate structure 29'. In other words, portion 83 is a dopant region that extends laterally from the first side of gate structure 29' to a position below gate structure 29' and portion 84 is a dopant region that extends laterally from the second side of gate structure 29' to a position below gate structure 29'. Simultaneously with the formation of portion 83 and 84, polysilicon gate electrode 29 is doped to be of N conductivity type, e.g., doped with arsenic. It shall be understood that the implant energy is set so that the impurity material of N conductivity type does not penetrate gate structure 29', and thus is not implanted into portion 76 of dopant layer 25.

Further, a portion 86 of a source region 90 and a portion 80 of a drain region 87 are formed in N-well 14 and are aligned to polysilicon gate electrode 31. To form dopant layers 86 and 80, an implant block mask (not shown) such as, for example, photoresist is formed over P-well 13 and an impurity material of P type conductivity is implanted into regions 90 and 87. More particularly, portion 86 is aligned to a first side of gate structure 31' and portion 80 is aligned to a second side of gate structure 31'. Portions 86 and 80 are of P conductivity type, and are formed using, for example, boron, and extend laterally under portions of gate structure 31'. In other words, portion 86 is a dopant region that extends laterally from the first side of gate structure 31' to a position below gate structure 31' and portion 80 is a dopant region that extends laterally from the second side of gate structure 31' to a position below gate structure 31'. Simultaneously with the formation of portions 86 and 80, polysilicon gate electrode 31 is doped to be of P conductivity type, e.g., doped with boron. It shall be understood that the implant energy is set so that the impurity material of P conductivity type does not penetrate gate structure 31', and thus is not implanted into portion 82 of dopant layer 30. By way of example, portions 83 and 86 and portions 84 and 80 extend vertically between approximately 0.2 $\mu$m and approximately 0.3 $\mu$m into their respective wells 13 and 14 from major surface 12. Preferably portions 83 and 86 are contained within halo regions 74 and 81, respectively and portions 84 and 80 are contained within halo regions 75 and 79, respectively.

Now referring to FIG. 13, an oxide layer (not shown) is formed on oxide layer 32. The oxide layer has a thickness on the order of 300 angstroms and may be formed by well known processes such as a tetraethylorthosilicate (TEOS) deposition process. Dielectric spacers 46 are formed along the portions of oxide layer 32 lining the sidewalls of polysilicon gate electrodes 29 and 31. By way of example, dielectric spacers 46 are nitride spacers.

A portion 88 of a source region 85 and a portion 89 of a drain region 72 are formed in P-well 13 adjacent to dielectric spacer 46. To form dopant layers 88 and 89, an implant block mask (not shown) such as, for example, photoresist is formed over N-well 14 and an impurity material of N conductivity type is implanted into regions 85 and 72. More particularly, portion 88 is formed in a portion of P-well 13 aligned to dielectric spacer 46 along a first side of gate structure 29' and portion 89 is formed in a portion of P-well 13 aligned to dielectric spacer 46 along a second side of gate structure 29'. Portions 88 and 89 are of N conductivity type, are formed using, for example, arsenic, and extend laterally under dielectric spacer 46. It should also be understood that portion 88 is contained within halo region 74 and portion 89 is contained within halo region 75. Simultaneously with the formation of portions 88 and 89, polysilicon gate electrode 29 is further doped to be of N conductivity type, e.g., doped with arsenic. It shall be understood that the implant energy is set so that the impurity material of N conductivity type does not penetrate gate structure 29' or dielectric spacer 46, and thus is not implanted into portion 76 of dopant layer 25.

Further, a portion 92 of source region 90 and a portion 91 of drain region 87 are formed in N-well 14 and are aligned to dielectric spacers 46 adjacent polysilicon gate electrode 31. To form dopant layers 92 and 91, an implant block mask (not shown) such as, for example, photoresist is formed over P-Well 13 and an impurity material of P type conductivity is implanted into regions 90 and 87, respectively. More particularly, portion 92 is aligned to dielectric spacer 46 adjacent a first side of gate structure 31' and portion 91 is aligned to dielectric spacer 46 adjacent a second side of gate structure 31'. Portions 92 and 91 are of P conductivity type, and are formed using, for example, boron, and extend laterally under portions of dielectric spacers 46 adjacent gate structure 31'. It should be understood that halo region 81 extends further under dielectric spacer 46 than portion 92 and halo region 71 extends further under dielectric spacer 46 adjacent the first side of gate structure 31' than portion 91. Simultaneously with the formation of portions 92 and 91, polysilicon gate electrode 31 is doped to be of P conductivity type, e.g., doped with the boron. It should be understood that the implant energy is set so that the impurity material of P conductivity type does not penetrate gate structure 31' or dielectric spacer 46, and thus is not implanted into portion 82 of dopant layer 30. By way of example, portions 88 and 92 and portions 89 and 91 extend deeper vertically than approximately 0.2 $\mu$m into their respective wells 13 and 14 from major surface 12. Preferably portions 88 and 92 are contained within halo regions 74 and 81, respectively and portions 89 and 91 are contained within halo regions 75 and 79, respectively.

Dopant regions 88 and 92 are formed through first portions 83 and 86, respectively, wherein dopant regions 88 and 92 extend into their respective halo regions 74 and 81. Dopant regions 88 and 92 serve as portions of source regions 85 and 90, respectively. In other words, portion 83 and portion 88 cooperate to form source region 85 and portion 86 and portion 92 cooperate to form source region 90. It should be understood that portions 88 and 92 do not extend beyond halo regions 74 and 81, respectively, i.e., portion 88 is vertically bounded by halo region 74 and portion 92 is vertically bounded by halo region 81.

Still referring to FIG. 13, dopant regions 89 and 91 are formed through first portions 84 and 80, respectively, wherein dopant regions 89 and 91 extend into halo regions 75 and 79. Dopant regions 89 and 91 serve as portions of drain regions 72 and 87, respectively. In other words, portion 84 and portion 89 cooperate to form drain region 72, and portion 80 and portion 91 cooperate to form drain region 87. It should be understood that portions 89 and 91 do not extend beyond halo regions 75 and 79, respectively, i.e., portion 89 is vertically bounded by halo region 75 and portion 91 is vertically bounded by halo region 79.

Portions 83 and 84 are shallower than portions 88 and 89, respectively. Likewise, portions 86 and 80 are shallower than portions 92 and 91, respectively. It should be understood that dopant concentrations at the intersection of portion 88 and halo region 74 may be approximately the same as the dopant concentrations at the intersection of portion 83 and halo region 74. Likewise, dopant concentrations at the intersection of portion 92 and halo region 81 may be approximately the same as the dopant concentrations at the intersection of portion 86 and halo region 81. The advantages of separately setting the dopant concentrations at the intersection of portions 83 and 86 and their respective halo regions 74 and 81 are that the portions 83 and 86 of the source regions 85 and 90, respectively, can be optimized for $V_T$ control, whereas the intersection of region 88 and 92 with halo regions 74 and 81, respectively, can be optimized for punchthrough protection and body effect while allowing for the integration of subsequent process modules. Further, the intersection of region 89 and 91 with halo regions 75 and 79, respectively, can be optimized for junction capacitances and breakdown voltages while allowing for the integration of subsequent process modules. Methods for forming dielectric spacers and dopant regions are well known to those skilled in the art.

Now referring to FIG. 14 and using techniques well known to those skilled in the art, electrodes are formed which contact regions 88, 89, 91, and 92. For example, a silicide 53 may be formed in source regions 88 and 92, drain regions 89 and 91 and in polysilicon gate electrodes 29 and 31. One set of nitride spacers 46 prevent source and drain regions 88 and 89, respectively, from being shorted with polysilicon gate electrode 29 and another set of nitride spacers 46 prevent source and drain regions 92 and 91, respectively, from being shorted with polysilicon gate electrode 31 after silicidation. An insulating layer 54 is formed on device 70, i.e., on field oxide regions 24, source regions 88 and 92, drain regions 89 and 91, and polysilicon gate electrodes 29 and 31. A plurality of openings (not shown) are formed in insulating layer 54 to expose portions of silicide 53 in source regions 88 and 92, drain regions 89 and 91, and polysilicon gate electrodes 29 and 31. Source and drain electrodes 101 and 102, respectively, are formed to contact the silicide 53 in the respective source and drain regions 88 and 89. Further, source and drain electrodes 94 and 93, respectively, are formed to contact the silicide 53 in the respective source and drain regions 92 and 91, and gate electrodes 96 and 97 are formed to contact the silicide 53 on polysilicon gate electrodes 29 and 31, respectively. Methods of forming electrodes to silicided regions are well known to those skilled in the art.

Thus, the bilateral embodiment of the present invention comprises a method for fabricating complementary insulated gate semiconductor device 70 having source regions 88 and 92, drain regions 89 and 91, and gate electrodes 29 and 31. Although a complementary low power insulated gate semiconductor device 70 has been described, it shall be understood that individual bilateral N-channel and P-channel insulated gate semiconductor devices may also be fabricated in accordance with the present invention.

By now it should be appreciated that a method of forming insulated gate field effect transistors having process steps for independently setting vertical and lateral dopant concentration profiles of the source/drain regions has been provided. In the present invention, the lateral and the vertical dopant concentration profiles for the source/drain regions are manipulated independently from each other to improve punch-through and threshold voltage control, lower parasitic capacitances, lower body effect, lower subthreshold leakage currents, and increase breakdown voltages. For example, a source/drain region may have a shallow heavily doped portion to improve threshold voltage control and lower leakage currents, permitting the use of lower power supply voltages and resulting in lower power consumption. Another portion of the source/drain region is deeper than the shallower heavily doped portion and reduces the parasitic junction capacitance, resulting in a lower switching power consumption.

We claim:

1. A method for fabricating an insulated gate field effect transistor, comprising the steps of:

providing a semiconductor substrate of a first conductivity type having a major surface;

forming a gate structure on a portion of the major surface, the gate structure having first and second sides;

forming an implant block mask over a first portion of the gate structure and over the portion of the semiconductor substrate adjacent the second side of the gate structure, the implant block mask having an opening over the portion of the semiconductor substrate adjacent the first side of the gate structure;

forming a first dopant region of the first conductivity type in the semiconductor substrate, wherein the first dopant region is aligned to the first side of the gate structure, extends vertically a first distance into the semiconductor substrate from the major surface, and extends laterally a second distance from the first side of the gate structure to a first position below the gate structure;

removing the implant block mask;

forming a second dopant region of a second conductivity type in the first dopant region, wherein the second dopant region is aligned to the first side of the gate structure, extends vertically a third distance into the first dopant region from the major surface, and extends laterally a fourth distance from the first side of the gate structure to a second position below the gate structure;

forming a third dopant region of the second conductivity type in the first dopant region, wherein the third dopant region extends vertically a fifth distance into a portion of the first dopant region, the third dopant region being laterally spaced apart from the first side of the gate structure;

forming a fourth dopant region of the second conductivity type in a portion of the semiconductor substrate on the second side of the gate structure, the fourth dopant region extending vertically a seventh distance into the semiconductor substrate from the major surface;

forming a first electrode in contact with a portion of the third dopant region;

forming a second electrode in contact with a portion of the fourth dopant region; and forming a third electrode in contact with a portion of the gate structure.

2. The method of claim 1, wherein the step of forming a third dopant region includes forming spacers along the sides of the gate structure and implanting a dopant of the second conductivity type into the portion of the second dopant region to form the third dopant region.

3. The method of claim 1, further including forming a sixth dopant region in the semiconductor substrate, the sixth dopant region extending through a portion of the fourth dopant region into the fifth dopant region, laterally spaced apart from the second side of the gate structure, and extending a tenth distance into the fifth dopant region from the major surface.

4. The method of claim 1, wherein the step of providing a semiconductor substrate of a first conductivity type further comprises forming a dopant layer of a first conductivity type in a portion of the semiconductor substrate, a portion of the dopant layer covered by the gate structure and a portion of the dopant layer uncovered by the gate structure.

5. The method of claim 4, further including forming the dopant layer to be less than the product of twice the Debye length and the natural logarithm of the square root of a ratio of a surface concentration to an intrinsic carrier concentration.

6. The method of claim 4, wherein the first distance is greater than the fifth distance, the fifth distance is greater than the third distance, and the second distance is greater than the fourth distance.

7. A method for fabricating insulated gate field effect transistors which improves at least a breakdown voltage and a parasitic capacitance, comprising the steps of:
   providing a semiconductor material having a major surface, wherein the semiconductor material has a first dopant well of a first conductivity type;
   forming a first gate structure having a first side and a second side on a portion of the first dopant well;
   forming a first implant block mask over a first portion of the first gate structure and over a portion of the semiconductor substrate adjacent the second side of the first gate structure;
   doping a first portion of the first dopant well with an impurity material of the first conductivity type, the first portion aligned to the first side of the first gate structure and extending laterally below the first gate structure;
   removing the first implant block mask;
   doping a first sub-portion of the first portion of the first dopant well with an impurity material of a second conductivity type, the first sub-portion extending laterally below the first gate structure;
   doping a second sub-portion of the first portion of the first dopant well with the impurity material of the second conductivity type, the second sub-portion vertically extending through the first sub-portion and laterally contained within the first sub-portion;
   doping a second portion of the first dopant well with the impurity material of the second conductivity type, the second portion aligned to a second side of the first gate structure;
   forming a first electrode in contact with the second sub-portion and a second electrode in contact with the second portion of the first dopant well; and
   forming a third electrode in contact with the first gate structure.

8. The method of claim 7, further including the step of forming a spacer adjacent at least the first side of the first gate structure before the step of doping the second sub-portion of the first portion of the first dopant well.

9. The method of claim 7, further including doping a third portion of the first dopant well with the impurity material of the first conductivity type, the third portion aligned to the second side of the first gate structure, laterally extending below the first gate structure, and doped after the step of doping a first portion of the first dopant well with an impurity material of the first conductivity type.

10. The method of claim 9, wherein the step of doping a second portion of the first dopant well with the impurity material of the second conductivity type further comprises the steps of:
   forming a second implant block mask over a portion of the semiconductor substrate adjacent the first dopant well;
   doping a third sub-portion of the second portion of the first dopant well with the impurity material of the second conductivity type, the third sub-portion laterally extending below the first gate structure;
   doping a fourth sub-portion of the second portion of the first dopant well with the impurity material of the second conductivity type, the fourth sub-portion vertically extending through the third sub-portion and laterally contained within the third sub-portion; and
   removing the second implant block mask.

11. The method of claim 7, wherein the step of providing a semiconductor material having a major surface further comprises providing the semiconductor material having a second dopant well, the second dopant well of the second conductivity type and further comprising the steps of:
   forming a second gate structure having a first side and a second side on a portion of the second dopant well;
   doping a first portion of the second dopant well with an impurity material of the second conductivity type, the first portion aligned to the first side of the second gate structure and laterally extending below the second gate structure;
   doping a fifth sub-portion of the first portion of the second dopant well with an impurity material of the first conductivity type, the fifth sub-portion laterally extending below the second gate structure;
   doping a sixth sub-portion of the first portion of the second dopant well with the impurity material of the first conductivity type, the sixth sub-portion vertically extending through the fifth sub-portion and laterally contained within the fifth sub-portion;
   doping a second portion of the second dopant well with the impurity material of the first conductivity type, the second portion of the second dopant well aligned to the second side of the second gate structure;
   forming a fourth electrode in contact with the sixth sub-portion of the second dopant well and a fifth electrode in contact with the second portion of the second dopant well; and
   forming a sixth electrode in contact with the second gate structure.

12. The method of claim 11, wherein the step of doping a second portion of the second dopant well with the impurity material of the first conductivity type further comprises the steps of:
   doping a seventh sub-portion of the second portion of the second dopant well with an impurity material of the first conductivity type, the seventh sub-portion laterally extending below the second gate structure;
   doping an eighth sub-portion of the second portion of the second dopant well with the impurity material of the first conductivity type, the eighth sub-portion vertically extending through the seventh sub-portion and laterally contained within the seventh sub-portion.

13. The method of claim 11, wherein the step of providing a semiconductor material having a major surface further comprises the steps of:
   forming a first dopant layer of the first conductivity type in the first dopant well; and
   forming a second dopant layer of a second conductivity type in the second dopant well.

14. The method of claim 13, further including forming the first and second dopant layers to extend into the first and second dopant wells, respectively, a distance less than the product of twice the Debye length and the natural logarithm of the square root of a ratio of a surface concentration to an intrinsic carrier concentration.

15. A method for fabricating an insulated gate semiconductor device, comprising the steps of:
   forming a gate structure on a first portion of a semiconductor substrate, the gate structure having first and second sides and the semiconductor substrate of a first conductivity type;

forming a first implant block mask over a portion of the gate structure and over a portion of the semiconductor substrate adjacent the second side of the gate structure;

forming a first halo region of the first conductivity type in the semiconductor substrate, the first halo region on the first side of the gate structure;

removing the first implant block mask;

forming a first portion of a source region within the first halo region, the first portion of the source region of a second conductivity type;

forming a second portion of the source region within the first halo region, the second portion of the source region of the second conductivity type and extending vertically through the first portion of the source region and contained laterally within the first portion of the source region;

forming a drain region of the second conductivity type in the semiconductor substrate, the drain region on the second side of the gate structure;

forming a source electrode in contact with a portion of the second portion of the source region;

forming a drain electrode in contact with drain region; and forming a gate electrode in contact with the gate structure.

16. The method of claim 1, further including using photoresist as the implant block mask.

17. The method of claim 7, further including using photoresist as the first implant block mask.

18. The method of claim 10, further including using photoresist as the second implant block mask.

19. The method of claim 15, further including:

forming a dopant well of the second conductivity type in the semiconductor substrate;

forming another gate structure on a portion of the dopant well, the another gate structure having first and second sides;

forming a second implant block mask over a portion of the another gate structure and over a portion of the dopant well adjacent the second side of the another gate structure;

forming a second halo region, the second halo region of the second conductivity type, on the first side of the another gate structure, and within the dopant well;

removing the second implant block mask;

forming a first portion of another source region within the second halo region;

forming a second portion of the another source region, the second portion of the another source region of the second conductivity type and extending vertically through the first portion of the another source region and contained laterally within the first portion of the another source region;

forming a drain region of the second conductivity type in the dopant well, the drain region of the second conductivity type on the second side of the another gate structure;

forming another source electrode in contact with the second portion of the another source region;

forming another drain electrode in contact with the drain region of the second conductivity type; and forming another gate electrode in contact with the gate structure on the dopant well.

* * * * *